United States Patent
Bandoh

(10) Patent No.: US 7,646,027 B2
(45) Date of Patent: Jan. 12, 2010

(54) GROUP III NITRIDE SEMICONDUCTOR STACKED STRUCTURE

(75) Inventor: Akira Bandoh, Ichihara (JP)

(73) Assignee: Showa Denko K.K., Tokyo (JP)

( * ) Notice: Subject to any disclaimer, the term of this patent is extended or adjusted under 35 U.S.C. 154(b) by 300 days.

(21) Appl. No.: 11/416,112

(22) Filed: May 3, 2006

(65) Prior Publication Data

US 2006/0261353 A1 Nov. 23, 2006

Related U.S. Application Data

(60) Provisional application No. 60/679,978, filed on May 12, 2005.

(30) Foreign Application Priority Data

May 6, 2005 (JP) ............... 2005-134926

(51) Int. Cl.
   *H01L 33/00* (2006.01)
(52) U.S. Cl. ............... 257/79; 257/13; 257/102; 257/103; 257/E33.03; 257/E33.008; 257/E33.028
(58) Field of Classification Search ............ 257/13, 257/79, 102–103
   See application file for complete search history.

(56) References Cited

U.S. PATENT DOCUMENTS

| 6,365,921 | B1 | 4/2002 | Watanabe et al. |
| 6,555,846 | B1 * | 4/2003 | Watanabe et al. ............ 257/94 |
| 2002/0123246 | A1 * | 9/2002 | Asai et al. .................. 438/791 |
| 2003/0070607 | A1 | 4/2003 | Koike et al. |
| 2004/0169192 | A1 | 9/2004 | Kato et al. |
| 2004/0206299 | A1 | 10/2004 | Tadatomo et al. |
| 2005/0156153 | A1 | 7/2005 | Futagawa |
| 2006/0046511 | A1 | 3/2006 | Shibata et al. |

FOREIGN PATENT DOCUMENTS

| JP | 55-3834 | 1/1980 |
| JP | 2000-331947 | 11/2000 |
| JP | 2000-332364 | 11/2000 |
| JP | 2000-353821 | 12/2000 |
| JP | 2000-357820 | 12/2000 |
| JP | 2002-16001 | 1/2002 |
| JP | 2002-261027 | 9/2002 |
| JP | 2002-289527 | 10/2002 |

(Continued)

OTHER PUBLICATIONS

Shuji Nakamura. et al.; "Si- and Ge-Doped GaN Films Grown with GaN Buffer Layers"; Jpn. J. Appl. Phys.; vol. 31 (1992) p. 1; No. 9A; pp. 2883-2888.

*Primary Examiner*—A. Sefer
(74) *Attorney, Agent, or Firm*—Sughrue Mion, PLLC

(57) ABSTRACT

An object of the present invention is to provide a Group III nitride semiconductor stacked structure with a low dislocation density obtained by stacking only a semiconductor layer on a flat substrate by the use of a normal epitaxial growth method without processing the substrate or a deposit layer on the substrate, wherein the dislocation density is $1 \times 10^7 \, cm^{-2}$ or less.

The inventive Group III nitride semiconductor stacked structure comprises a substrate having a surface roughness (Ra) of 1 nm or less and a Group III nitride semiconductor layer directly stacked on the substrate, wherein the Group III nitride semiconductor layer comprises a plurality of layers put into contact with each other, the plurality of layers comprise a high-concentration impurity atom layer and a low-concentration impurity atom layer, and the high-concentration impurity atom layer is present on the substrate side.

12 Claims, 2 Drawing Sheets

FOREIGN PATENT DOCUMENTS

| | | | |
|---|---|---|---|
| JP | 2002-367908 | | 12/2002 |
| JP | 2003-17420 | * | 1/2003 |
| JP | 2003-124128 | | 4/2003 |
| JP | 2003-229645 | | 8/2003 |
| JP | 2004-35275 | | 2/2004 |
| JP | 2004-47764 | | 2/2004 |

* cited by examiner

GROUP III NITRIDE SEMICONDUCTOR STACKED STRUCTURE

CROSS REFERENCE TO RELATED APPLICATION

This application is an application filed under 35 U.S.C. § 111(a) and claiming benefit, pursuant to 35 U.S.C. §119(e)(1), of the filing date of the Provisional Application No. 60/679,978 filed on May 12, 2005, pursuant to 35 U.S.C. § 111(b).

TECHNICAL FIELD

The present invention relates to a Group III nitride semiconductor stacked structure, and a Group III nitride semiconductor light-emitting device using the same.

BACKGROUND ART

A Group III nitride semiconductor formed on a substrate has been heretofore used as a functional material for fabricating a Group III nitride semiconductor light-emitting device with a pn-junction type structure capable of emitting visible light at a short wavelength, such as a light-emitting diode (LED) and a laser diode (LD) (see, for example, Japanese Unexamined Patent Publication (Kokai) No. 2000-332364). For example, at the fabrication of an LED emitting near ultraviolet light, blue light or green light, aluminum gallium nitride ($Al_XGa_YN$, wherein $0 \leq X$, $Y \leq 1$ and $X+Y=1$) is formed on a substrate to a thickness of several μm (hereinafter referred to as an "underlying layer") and works to improve the crystallinity and at the same time, facilitate the taking-out of light. Also, this semiconductor is utilized for constituting an n-type or p-type clad layer (see, for example, Kokai No. 2003-229645). On the other hand, gallium indium nitride ($Ga_YIn_ZN$, wherein $0 \leq Y$, $Z \leq 1$ and $X+Z=1$) can be utilized for constituting a light-emitting layer (see, for example, Japanese Examined Patent Publication (Kokoku) No. 55-3834).

In the conventional Group III nitride semiconductor light-emitting device, the underlying layer is generally gallium nitride (GaN) formed through a GaN or AlN buffer layer, or aluminum gallium nitride ($Al_XGa_YN$, wherein $0 \leq X$, $Y \leq 1$ and $X+Y=1$) formed through a buffer layer, comprising AlGaN having an intermediate lattice constant, between the substrate and the underlying layer. In this case, the buffer layer plays the role of relieving the strain between the substrate and the underlying layer and aids in terminating a dislocation immediately after the underlying layer starts growing, thereby suppressing the propagation of a dislocation into the upper part of the underlying layer. Furthermore, the buffer layer reduces the propagation of a dislocation into the light-emitting layer, and the strain due to difference in the lattice constant, so as to give a small difference of lattice constant compared to a light-emitting layer comprising $Ga_Y In_ZN$ (wherein $0 \leq Y$, $Z \leq 1$ and $Y+Z=1$) or the like.

However, even in the underlying layer where the propagation of a dislocation is suppressed by the buffer layer, the dislocation density can be as large as about $1 \times 10^9$ cm$^{-2}$, and a reduction in dislocations is indispensable for enhancing the properties of a Group III nitride semiconductor light-emitting device. In this respect, studies have been made on the forming conditions of the buffer layer and the forming method of the underlying layer.

With respect to the method for this purpose, there have been heretofore proposed a method of applying a process of imparting irregularities to the substrate (see, for example, Kokai No. 2000-331947), forming an insulating film on the substrate (see, for example, Kokai No. 2002-16001), processing a stacked structure grown on the substrate (see, for example, Kokai No. 2004-35275) or forming an insulating film on a deposit (see, for example, Kokai No. 2002-289527) and, by utilizing the shape obtained, promoting the crystal growth in the transverse direction to terminate the dislocation. However, in such a method, as the substrate or a deposit layer on the substrate is processed, the formation of an insulating film or a patterning process such as photolithography and etching is complicated and the finally formed film allows for the presence of a dislocation distribution corresponding to the film shape.

Furthermore, a processing method of previously performing a pit-forming treatment before the epitaxial growth is sometimes employed (see, for example, Kokai No. 2003-124128 and Kokai No. 2002-261027). However, even in such a method, the process is cumbersome because the substrate, on which a film is grown, is once taken out from the growth furnace and, after applying a processing for the pit formation in the grown film, a layer capable of exerting a device function, such as light-emitting layer, is again grown.

As for the method of not processing the substrate or a deposit layer thereon, for example, pits are formed in the underlying layer and then filled up so as to cause change in the dislocation direction and terminate the dislocation, such as a method of growing a p-type doping layer or an n-type doping layer on irregularities generated on an undoped underlying layer, thereby flattening the irregularities (see, for example, Kokai No. 2000-353821 and Kokai No. 2000-357820), or a method of once stopping the growth to fill the pits up (see, for example, Kokai No. 2002-367908).

On the other hand, with respect to the pit generated in a Group III nitride semiconductor, it is known that pits are formed not only by selecting the growing conditions such as temperature and pressure but also by doping an impurity at a high concentration (see, for example, *Japan Journal of Applied Physics*, Vol. 31, pp. 2883-2888 (1992)). As for the method utilizing this, a method of doping Si at a fairly high concentration to form pits is known (see, for example, Kokai No. 2004-47764).

In the present invention, this formation of pits by the addition of an impurity is employed and a Group III nitride semiconductor stacked structure with a small dislocation density is obtained by controlling the kind of the impurity element added, the concentration of the impurity added, and the layer structure.

SUMMARY OF THE INVENTION

An object of the present invention is to provide a Group III nitride semiconductor layer with a low dislocation density obtained by stacking only a semiconductor layer on a flat substrate by the use of a normal epitaxial growth method without processing the substrate or a deposit layer on the substrate, wherein the dislocation density is $1 \times 10^7$ cm$^{-2}$ or less. Another object of the present invention is to provide a Group III nitride semiconductor light-emitting device and a lamp, each using the above-described Group III nitride semiconductor layer and ensuring excellent light emission efficiency.

The present invention provides the following inventions.

(1) A stacked structure for a Group III nitride semiconductor device, comprising a substrate having a surface roughness (Ra) of 1 nm or less and a Group III nitride semiconductor layer directly stacked on the substrate, the Group III nitride semiconductor layer comprising a plurality of layers put into contact with each other, and at least one of the plurality of layers being a layer having a dislocation density of $1 \times 10^7$ $cm^{-2}$ or less.

(2) The stacked structure for a Group III nitride semiconductor device according to (1) above, wherein at least a pair of layers out of the plurality of layers put into contact with each other in the Group III nitride semiconductor layer are a high-concentration impurity atom layer and a low-concentration impurity atom layer, and the high-concentration impurity atom layer is present on the substrate side.

(3) The stacked structure for a Group III nitride semiconductor device according to (2) above, wherein a high-concentration impurity atom layer and a low-concentration impurity atom layer are present alternately and periodically.

(4) The stacked structure for a Group III nitride semiconductor device according to (3) above, wherein the periodic number is from 1 to 10.

(5) The stacked structure for a Group III nitride semiconductor device according to any one of (2) to (4) above, wherein the impurity is one member selected from the group consisting of Si, Ge, Sn, S, Se, Mg and Zn, or a combination of two or more members selected therefrom.

(6) The stacked structure for a Group III nitride semiconductor device according to (5) above, wherein the impurity is Ge.

(7) The stacked structure for a Group III nitride semiconductor device according to any one of (2) to (6) above wherein, on the surface of the high-concentration impurity atom layer (the side opposite to the substrate), pits are present in the range from $1 \times 10^5$ $cm^{-2}$ to $5 \times 10^8$ $cm^{-2}$.

(8) The stacked structure for a Group III nitride semiconductor device according to any one of (2) to (7) above, wherein the impurity concentration of the high-concentration impurity atom layer is from $5 \times 10^{17}$ to $4 \times 10^{19}$ $cm^{-3}$.

(9) The stacked structure for a Group III nitride semiconductor device according to any one of (2) to (8) above, wherein the thickness of the high-concentration impurity atom layer is from 0.1 to 10 μm.

(10) The stacked structure for a Group III nitride semiconductor device according to any one of (2) to (9) above, wherein the impurity concentration of the low-concentration impurity atom layer is lower than the impurity concentration of the high-concentration impurity atom layer and is $2 \times 10^{19}$ $cm^{-3}$ or less.

(11) The stacked structure for a Group III nitride semiconductor device according to (10) above, wherein the low-concentration impurity atom layer is not intentionally doped with an impurity.

(12) The stacked structure for a Group III nitride semiconductor device according to any one of (2) to (11) above, wherein the thickness of the low-concentration impurity atom layer is from 0.1 to 10 μm.

(13) The stacked structure for a Group III nitride semiconductor device according to any one of (2) to (12) above, wherein the entire thickness of the high-concentration impurity atom layer and the low-concentration impurity atom layer is from 1 to 1,000 μm.

(14) A Group III nitride semiconductor light-emitting device having an n-type layer, a light-emitting layer and a p-type layer in this order, each comprising a Group III nitride semiconductor layer, on the stacked structure for a Group III nitride semiconductor device according to any one of (1) to (13) above, in which a negative electrode and a positive electrode are provided on the n-type layer and the p-type layer, respectively.

(15) A lamp comprising the light-emitting device according to (14) above.

In the stacked structure for a Group. III nitride semiconductor device of the present invention, the dislocation density of the Group III nitride semiconductor layer is very small and $1 \times 10^7$ $cm^{-2}$ or less. Accordingly, a Group III nitride semiconductor light-emitting device with excellent light emission efficiency can be produced by using this stacked structure. That is, in the case of a current injection-type light-emitting device, the crystal defect which traps a carrier and is a non-light-emitting center can be reduced and this is expected to yield an enhancement of light emission efficiency, an enhancement of the peak inverse voltage and an enhancement of electrostatic breakdown voltage for an LED device. Also, in a laser device, the threshold current can be reduced.

Furthermore, this stacked structure is obtained by stacking only a semiconductor layer on a flat substrate by the use of a normal epitaxial growth method without processing the substrate or a deposit layer on the substrate and, therefore, the production cost is very low.

DETAILED DESCRIPTION OF THE INVENTION

Figure 1:
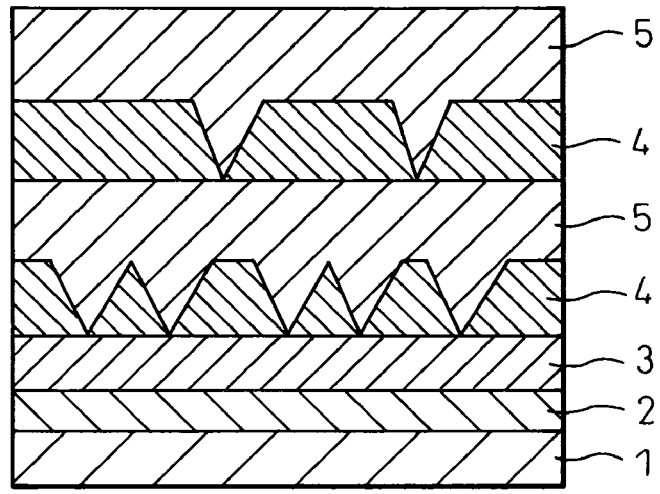
FIG. 1 is a view schematically showing the cross-sectional structure of the stacked structure of the present invention produced in Example 1.

Examples of the substrate on which a Group III nitride semiconductor layer is stacked in the present invention include a substrate comprising an oxide single crystal material having a relatively high melting point and heat resistance, such as sapphire (α-$Al_2O_3$ single crystal), zinc oxide (ZnO) and lithium gallium oxide (compositional formula: $LiGaO_2$), or a Group IV semiconductor single crystal such as silicon single crystal (silicon) and cubic or hexagonal crystal-type silicon carbide (SiC). In addition, a Group III-V compound semiconductor single crystal material such as gallium nitride (GaN), aluminum nitride (AlN) and gallium phosphide (GaP), may also be used. An optically transparent single crystal material capable of transmitting the light emitted from the light-emitting layer can be effectively utilized as the substrate.

The surface of the substrate must be a smooth surface subjected to mechanical and/or chemical polishing, and the surface roughness (Ra), usually used as the index of irregularities, is preferably 1 nm or less.

In the present invention, a flat substrate having a surface roughness (Ra) of 1 nm or less may be used as it is. Also, the present invention has a characteristic feature that the dislocation density of the Group III nitride semiconductor layer is reduced during a series of growth processes without once taking out a grown deposit layer from the growth furnace and processing the deposit layer.

More specifically, the semiconductor stacked structure stacked on a substrate having a flat surface comprises a layer for generating pits, which is doped with an impurity in a high concentration, and a layer for filling the pits, which has a low impurity concentration or comprises an undoped semiconductor. The low-concentration impurity layer or undoped layer grows while filling the inclined plane generated in the pit part to be nonparallel with the growth surface and in this process, the dislocation coming out to the inclined plane of a pit is bent in the transverse direction and terminated. As a result, the number of dislocations propagated into the upper part are decreased. By periodically repeating this process, the dislocation density is even more reduced.

By the use of this method, a cumbersome processing such as processing of the substrate or deposit layer thereon or surface processing by the heat treatment during the growth can be dispensed with, and a simple and easy process, ensuring a great effect of reducing the dislocations, can be obtained. Also, this method has an effect irrespective of the kind of the impurity element doped for the formation of pits and, as for the electrical conduction type, an n-type dopant and a p-type dopant may be used.

The effect is higher as the area of the pits in the growth surface is larger, and a great effect is obtained when almost the entire surface is covered with the pits. However, even when the entire surface is covered with the pits, if individual pits are small, the effect is low. Therefore, the pits need to have a certain size. If the pit size is too large, it becomes difficult to fill the pits and make flat the layer in which the pits are filled. Accordingly, the pit size and the pit density have respective optimal values.

However, the pits are filled up in the subsequent growth for filling up and if the pit-forming layer and the pit-filling layer are formed of the same substance, the pit size or pit density after the completion of growth cannot be confirmed. The pit size is dependent on the thickness of the pit-forming layer and therefore, the thickness of the pit-forming layer, namely, the high-concentration impurity atom layer, may be specified. In this case, it is important to previously confirm the pit density and perform the growth under the conditions that the entire surface is covered with pits. For the control of this pit formation state, an in-situ observation apparatus, for reflectivity, is effective. The reflectivity decreases with the formation of pits and when almost the entire surface is covered with pits, the reflectivity becomes a minimum.

When the entire surface is covered with pits, growth in the longitudinal direction does not proceed any more and even if the epitaxial growth is continued under the same conditions, an impurity may deposit on the inclined plane of a pit or a new defect may be formed. Accordingly, the formation of a pit-filling layer is preferably started soon after pits are formed. As means for monitoring this timing, the in-situ reflectivity observation apparatus is important.

The dislocation density can be roughly estimated, for example, by a transmission electron microscope (TEM). This is a method of processing a sample to an ultrathin film, irradiating an electron beam thereon, and examining the diffraction pattern of the electron beam, and the propagation manner and density of the dislocation in the crystal can be measured. In the case of measuring only the dislocation density, this may also be estimated by measuring the etch pit density. In this case, the surface of epitaxial layer is treated with a chemical to cause a reaction selectively in the portion where a dislocation is present and, as a result, pits of which profile or number corresponds to the kind or density of dislocation are formed on the surface. Furthermore, cathode luminescence (CL) can be used. This is a method of irradiating an electron beam, thereby exciting a crystal to emit light having an energy corresponding to the band gap. The light emission in the position having a dislocation is weak as compared with other portions, and the dislocation position can be known from the contrast of light emission. In the present invention, the method of measuring the dislocation density by the formation of etch pits is employed.

The high-concentration impurity atom layer for forming pits and the low-concentration impurity atom layer for filling the pits are formed by varying the amount of an impurity supplied as the doping source to the vapor phase growth reaction system during the vapor phase growth of the Group III nitride semiconductor layer. For example, these layers are formed by supplying a large amount of an impurity as the doping source to the vapor phase growth reaction system for a predetermined time, and then growing an undoped layer, namely, a layer where the concentration of an impurity atom intentionally added is zero, for a predetermined time without supplying an impurity to the vapor phase growth reaction system.

When the amount of this impurity doping source supplied to the vapor phase growth reaction system is increased or decreased, a layer in which pits are formed and a layer for filling the pits can be periodically formed. In the present invention, the Group III nitride semiconductor stacked structure comprising a high-concentration impurity atom layer and a low-concentration impurity atom layer preferably has a constitution that a layer having a high impurity atom concentration and a layer having a low impurity atom concentration are alternately and periodically stacked in this way.

The Group III nitride semiconductor stacked structure comprising a high-concentration impurity atom layer and a low-concentration impurity atom layer may be directly provided on the substrate, if desired, through a conventional well-known buffer layer. By virtue of providing a buffer layer, the density of pits generated in the Group III nitride semiconductor stacked structure can be controlled. The buffer layer may formed of, for example, aluminum gallium nitride ($Al_X Ga_Y N$, wherein $0 \leq X, Y \leq 1$ and $X+Y=1$). Also, after providing a conventional well-known underlying layer on the substrate, the Group III nitride semiconductor stacked structure may be provided thereon. Alternatively, after providing the Group III nitride semiconductor stacked structure on the substrate, a conventional well-known underlying layer may be provided thereon to produce the stacked structure of the present invention.

In the case of providing an underlying layer, the underlying layer preferably comprises an $Al_X Ga_{1-X} N$ layer ($0 \leq X \leq 1$, preferably $0 \leq X \leq 0.5$, more preferably $0 \leq X \leq 0.1$). The film thickness thereof is 0.1 µm or more, preferably 0.5 µm or more, more preferably 1 µm or more. With such a film thickness, an $Al_X Ga_{1-X} N$ layer having good crystallinity can be easily obtained. In the present invention, the film thickness of the underlying layer is not particularly limited in its upper limit, but if the film thickness is too large, the cost rises. Therefore, the film thickness of the underlying layer is preferably 10 µm or less, more preferably 8 µm or less, still more preferably 5 µm or less.

The underlying layer may be doped with an n-type impurity within the range from $1 \times 10^{17}$ to $1 \times 10^{19}/cm^3$ but from the standpoint of maintaining good crystallinity, is preferably undoped ($<1 \times 10^{17}/cm^3$). The n-type impurity is not particularly limited, but examples thereof include Si, Ge and Sn, with Si and Ge being preferred.

The film thickness of the layer containing an impurity atom in a high concentration for forming pits is suitably from 0.1 to 10 µm, preferably from 0.3 to 5 µm, more preferably from 0.5 to 3 µm. If this film thickness is less than 0.1 µm, a sufficiently large pit may not be obtained and, as the probability of a dislocation impinging on that portion decreases, the effect of terminating the dislocation is low, whereas, if it exceeds 10

μm, an excessively large pit is formed and cannot be filled up with a layer having a low impurity atom concentration and this gives rise to poor flatness and, in turn, poor flatness of the light-emitting layer stacked on the stacked structure of the present invention. As a result, the characteristics of the light-emitting device are worsened.

The pit density of the layer containing an impurity atom in a high concentration for forming pits is suitably from $1 \times 10^5$ to $5 \times 10^8$ cm$^{-2}$, preferably from $1 \times 10^6$ to $1 \times 10^8$ cm$^{-2}$, more preferably from $5 \times 10^6$ to $5 \times 10^7$ cm$^{-2}$. When the pit density is controlled to fall in this range, pits spread almost over the entire surface of the pit-forming layer, namely, the high-concentration impurity atom layer, and the probability of a dislocation entering this pit and inflecting its direction becomes maximum.

The pit density can be measured, for example, by a differential interference microscope or a fluorescent microscope. An epitaxial film in the state of pits being formed in the high-concentration layer can be observed at a magnification of 50 to 500, whereby the pit density can be calculated.

The film thickness of the layer containing an impurity atom in a low concentration is, similar to the layer containing an impurity atom in a high concentration, preferably from 0.1 to 10 μm, more preferably from 0.3 to 5 μm, still more preferably from 0.5 to 3 μm. If the film thickness is less than 0.1 μm, pits formed in the high-concentration layer cannot be satisfactorily filled up and the flatness is impaired, whereas even if the film thickness exceeds 10 μm, the effect is not increased any more.

In the layer containing an impurity atom in a low concentration, the growth parameters may be varied so as to accelerate the progress of a dislocation toward the transverse direction at the time of filling the pits, for example, the growth temperature may be elevated, the growth pressure may be decreased, the growth rate may be decreased, or V/III ratio may be increased.

In the present invention, a pair of a high-concentration layer and a low-concentration layer put into contact with each other is called one cycle. The total of the film thickness of high-concentration layer and the film thickness of low-concentration layer in each cycle, that is, the film thickness of one cycle, is suitably from 0.2 to 20 μm, preferably from 0.6 to 10 μm, more preferably from 1 to 6 μm. If this film thickness exceeds 20 μm, pits cannot be filled up, giving poor flatness, or when the cycle is repeated, the total film thickness becomes large and this is disadvantageous in view of processing, whereas if it is less than 0.2 μm, the supply amount of the n-type impurity raw material must be frequently varied and the working efficiency decreases.

In the case where the thickness of the high-concentration layer is larger than that of the low-concentration layer in one cycle, the pit formation cannot be satisfactorily controlled and sufficiently high flatness cannot be obtained, whereas when the thickness of the low-concentration layer is equal to or larger than that of the high-concentration layer in one cycle, good flatness is obtained. Accordingly, the thickness of the low-concentration layer is preferably not less than the thickness of the high-concentration layer.

The entire layer thickness of the high-concentration impurity atom layers and low-concentration impurity atom layers is preferably from 1 to 1,000 μm, more preferably from 2 to 100 μm, still more preferably from 4 to 20 μm. If the layer thickness is less than 1 μm, the probability of a dislocation terminating decreases, whereas even if the layer thickness exceeds 1,000 μm, the effect does not differ so much and only an increase in the cost results.

From the thickness of one cycle and the entire thickness, the number of cycles stacked is preferably from 1 to 50, more preferably from 1 to 10, still more preferably from 1 to 5. For example, assuming that the repetition of a high-concentration layer having a thickness of 2 μm and a low-concentration layer having a thickness of 2 μm is one cycle, these layers are stacked in three cycles to form a Group III nitride semiconductor stacked structure having a total thickness of 12 μm.

The dislocation density decreases as the number of cycles increases. However, as the generation of pits decreases along with the decrease in the dislocation density, the number of pits formed in the high-concentration impurity atom layer also decreases as the number of cycles increases. Accordingly, the effect of decreasing the dislocation density becomes difficult to obtain as the number of cycles increases. Moreover, due to an increase in the thickness of the entire layer, cracks or the like may be generated. The optimal number of cycles can be determined from the effective relationship between the thickness of each layer and the entire thickness.

Examples of the impurity which can be used for forming pits include silicon (Si), germanium (Ge), tin (Sn), sulfur (S), selenium (Se), tellurium (Te), magnesium (Mg) and zinc (Zn).

Among these, Ge is preferred, because formation of pits is facilitated as compared with other impurities and therefore, the pit density can be readily controlled.

The concentration of the impurity atom in the high-concentration layer varies depending on the kind of an impurity used and the compound thereof. If the concentration is low, pits cannot be produced and the effect is not obtained, whereas if the concentration is excessively high, too many pits are produced to prevent the existence of a flat part and when the pits are filled up by the low-concentration layer, flatness may not be recovered. Usually, the impurity atom concentration is preferably from $5 \times 10^{17}$ cm$^{-3}$ to $4 \times 10^{19}$ cm$^{-3}$. The impurity atom concentration in the high-concentration layer need not be always constant over the entire Group III nitride semiconductor stacked structure, and the concentration may be continuously or discontinuously changed every each cycle. Also, the impurity atom concentration may be changed inside individual layers. Furthermore, the impurity element need not be one element and may be a combination of two or more kinds of elements.

The concentration of the impurity atom in the low-concentration layer is preferably lower than the concentration of the impurity atom in the high-concentration layer and, at the same time, is preferably set to $2 \times 10^{19}$ cm$^{-3}$ or less, because as the concentration is lower, the effect of filling the pits is higher. The lower limit is preferably as low as possible, and it is preferred not to intentionally dope an impurity. When the low-concentration layer is constituted by an undoped Group III nitride semiconductor layer so as to reduce the impurity atom concentration, the effect of filling the all pits generated on the surface of the high-concentration layer is more enhanced and this is preferred for obtaining a semiconductor layer having a flat surface.

In the low-concentration layer, similarly to the high-concentration layer, the impurity atom concentration of the low-concentration layer need not be always constant over the entire semiconductor layer, and the concentration may be continuously or discontinuously changed every each cycle. Also, the impurity atom concentration may be changed inside individual layers. Furthermore, the impurity element need not be one element and may be a combination of two or more kinds of elements. In this case, the combination may be a combination of an n-type impurity and a p-type impurity.

The impurity atom concentration can be measured, for example, by secondary ion mass spectrometry (SIMS). This is a technique of irradiating a primary ion on the sample surface and mass-analyzing the ionized and emitted element, and the concentration distribution of a specific element in the depth direction can be observed and quantitatively determined. This technique is effective also for detecting the impurity element present in the Group III nitride semiconductor layer. At this time, the thickness of each layer can be also calculated.

As for the Group III nitride semiconductor stacked on the substrate, there are known, for example, a large number of Group III nitride semiconductors represented by the formula $Al_XGa_YIn_ZN_{1-A}M_A$ (wherein $0 \leq X \leq 1$, $0 \leq Y \leq 1$, $0 \leq Z \leq 1$ and $X+Y+Z=1$; M represents a Group V element except for nitrogen (N); and $0 \leq A < 1$). Also in the present invention, Group III nitride semiconductors represented by the formula $Al_XGa_YIn_ZN_{1-A}M_A$ (wherein $0 \leq X \leq 1$, $0 \leq Y \leq 1$, $0 \leq Z \leq 1$ and $X+Y+Z=1$; M represents a Group V element except for nitrogen (N); and $0 \leq A < 1$) including those well-known Group III nitride semiconductors can be used without any limitation.

The Group III nitride semiconductor may contain other Group III element in addition to Al, Ga and In and, if desired, may contain an element such as Ge, Si, Mg, Ca, Zn, Be, P, As and B. Furthermore, the semiconductor sometimes contains not only the elements intentionally added but also an impurity inevitably mingled depending on the film-forming conditions and the like and a trace impurity contained in the raw materials and reaction tube material.

The method for growing the Group III nitride semiconductor is not particularly limited and the methods known to grow a Group III nitride semiconductor, such as MOCVD (metalloorganic chemical vapor deposition), HVPE (hydride vapor phase epitaxy) and MBE (molecular beam epitaxy), all can be employed. Among these growth methods, an MOCVD method is preferred in view of film thickness controllability and mass productivity. In the MOCVD method, hydrogen ($H_2$) or nitrogen ($N_2$) is used as the carrier gas, trimethylgallium (TMG) or triethylgallium (TEG) is used as the Ga source which is a Group III raw material, trimethylaluminum (TMA) or triethylaluminum (TEA) is used as the Al source, trimethylindium (TMI) or triethylindium (TEI) is used as the In source, and ammonia ($NH_3$), hydrazine ($N_2H_4$) or the like is used as the N source which is a Group V raw material.

Examples of the usable raw material for an impurity which is doped include hydrides of respective elements, such as monosilane ($SiH_4$), disilane ($SiH_6$), germane ($GeH_4$), hydrogen sulfide ($H_2S$), hydrogen selenide ($H_2Se$) and hydrogen telluride ($H_2Te$); and organic compounds of respective elements, such as tetramethylsilicon (($CH_3)_4Si$), tetraethylsilicon (($C_2H_5)_4Si$), tetramethylgermanium (($CH_3)_4Ge$), tetraethylgermanium (($C_2H_5)_4Ge$), diethylselenium (($C_2H_5)_2Se$), diisopropylselenium (($C_3H_7)_2Se$), diethylsulfide (($C_2H_5)_2S$), diisopropylsulfide (($C_3H_7)_2S$), tetramethyltin (($CH_3)_4Sn$), tetraethyltin (($C_2H_5)_4Sn$), dimethyltellurium (($CH_3)_2Te$), diethyltellurium (($C_2H_5)_2Te$), cyclopentadienylmagnesium ($Cp_2Mg$) and diethylzinc (($C_2H_5)_2Zn$). In the MBE method, an elemental form (a metal) can also be used as the doping source.

In the MOCVD method, a Group III nitride semiconductor layer according to the purpose is preferably grown on the substrate by using the above-described raw materials at a temperature of 900 to 1,250° C.

In the case of producing a Group III nitride semiconductor device by using the stacked structure of the present invention, various Group III nitride semiconductor layers according to the objective semiconductor device, electrodes and the like may be sequentially stacked on the Group III nitride semiconductor layer of the stacked structure. As described above, at least the upper Group III nitride semiconductor layer of the stacked structure of the present invention has a very small dislocation density of $1 \times 10^7$ cm$^{-2}$ or less, so that the Group III nitride semiconductor layer stacked thereon can have excellent crystallinity and a high-performance semiconductor device can be obtained.

For example, in the case where the objective device is a light-emitting device, an n-type layer, a light-emitting layer and a p-type layer, each comprising a Group III nitride semiconductor, may be stacked in this order on the stacked structure of the present invention, and a negative electrode and a positive electrode may be provided on the n-type layer and the p-type layer, respectively.

The n-type layer usually comprises an n-contact layer and an n-clad layer. The n-contact layer may serve also as a clad layer.

The n-contact layer is preferably constituted by an $Al_XGa_{1-X}N$ layer (wherein $0 \leq X \leq 1$, preferably $0 \leq X \leq 0.5$, more preferably $0 \leq X \leq 0.1$). This layer is preferably doped with an n-type impurity and from the standpoint of maintaining good ohmic contact with the negative electrode, suppressing the generation of cracking and maintaining good crystallinity, the n-type impurity is preferably contained in a concentration of $1 \times 10^{17}$ to $1 \times 10^{19}$/cm$^3$, more preferably from $1 \times 10^{18}$ to $1 \times 10^{19}$/cm$^3$. The n-type impurity is not particularly limited, but examples thereof include Si, Ge and Sn, with Si and Ge being preferred. The film thickness is not particularly limited but is usually from 0.1 to 10 pn, preferably from 0.5 to 8 μm, more preferably from 1 to 5 μm.

The n-clad layer may be formed of AlGaN, GaN, GaInN or the like. In the case of GaInN, the band gap is, of course, preferably made to be larger than that of GaInN of the light-emitting layer. The film thickness of the n-clad layer is not particularly limited but is preferably from 0.005 to 0.5 μm, more preferably from 0.005 to 0.1 μm. The n-type dope concentration of the n-clad layer is preferably from $1 \times 10^{17}$ to $1 \times 10^{20}$/cm$^3$, more preferably from $1 \times 10^{18}$ to $1 \times 10^{19}$/cm$^3$. The dope concentration in this range is preferred from the standpoint of maintaining good crystallinity and reducing the operating voltage of the device.

As for the light-emitting layer stacked on the n-type layer, a light-emitting layer comprising a Group III nitride semiconductor, preferably a Group III nitride semiconductor of $Ga_{1-s}In_sN$ ($0 < s < 0.4$), is usually used. The film thickness of the light-emitting layer is not particularly limited, but the light-emitting layer may have a film thickness large enough to give a quantum effect, that is, a critical film thickness. For example, the film thickness is preferably from 1 to 10 nm, more preferably from 2 to 6 nm. The film thickness in this range is preferred in view of light emission output. The light-emitting layer may have, other than the above single quantum well (SQW) structure, a multiple quantum well (MQW) structure comprising the above-described $Ga_{1-s}In_sN$ as the well layer and an $Al_cGa_{1-c}N$ (wherein $0 \leq c < 0.3$) barrier layer having a band gap energy larger than that of the well layer. Also, the well layer and the barrier layer each may be doped with an impurity.

The p-type layer is usually constituted by a p-clad layer and a p-contact layer, but the p-contact layer may serve also as the p-clad layer. The p-clad layer is not particularly limited as long as it has a composition of giving a band gap energy larger than that of the light-emitting layer and can confine a carrier in the light-emitting layer, but an $Al_dGa_{1-d}N$ (wherein $0 < d \leq 0.4$, preferably $0.1 \leq d \leq 0.3$) clad layer is preferred. The p-clad layer comprising such AlGaN is preferred in view of carrier confinement in the light-emitting layer. The film thickness of the p-clad layer is not particularly limited but is preferably from 1 to 400 nm, more preferably from 5 to 100 nm. The p-type dope concentration of the p-clad layer is preferably from $1\times10^{18}$ to $1\times10^{21}/cm^3$, more preferably from $1\times10^9$ to $1\times10^{20}/cm^3$. When the p-type dope concentration is in this range, a good p-type crystal can be obtained without reducing the crystallinity.

The p-contact layer is a Group III nitride semiconductor layer comprising at least $Al_eGa_{1-e}N$ (wherein $0 \leq e < 0.5$, preferably $0 \leq e \leq 0.2$, more preferably $0 \leq e \leq 0.1$). The Al composition in this range is preferred from the standpoint of maintaining good crystallinity and obtaining good ohmic contact with the positive electrode. When a p-type dopant is contained in a concentration of $1\times10^{18}$ to $1\times10^{21}/cm^3$, preferably from $5\times10^{19}$ to $5\times10^{20}/cm^3$, this is preferred in the light of maintaining good ohmic contact, preventing generation of cracking, and maintaining good crystallinity. The p-type impurity is not particularly limited but preferred examples thereof include Mg. The film thickness is not particularly limited but is preferably from 0.01 to 0.5 μm, more preferably from 0.05 to 0.2 μm. The film thickness in this range is preferred in view of light emission output.

A negative electrode and a positive electrode are provided on the n-contact layer and the p-contact layer, respectively, by a technique well-known and commonly used in this technical field. Also, as for respective structures, any structure including conventionally known structures may be used without limitation.

A semiconductor light-emitting device is produced by using the stacked structure for a Group III nitride semiconductor device of the present invention and, for example, a transparent cover is provided thereon by a technique well-known in the art, whereby a lamp can be manufactured. Also, by combining the Group III nitride semiconductor light-emitting device of the present invention with a cover having a phosphor, a white lamp can be manufactured.

EXAMPLES

The present invention is described in greater detail below by referring to Examples, but the present invention is not limited to these Examples.

Example 1

FIG. 1 is a view schematically showing the cross-sectional structure of the stacked structure for a Group III nitride semiconductor device, produced in this Example.

The structure where a Group III nitride semiconductor is stacked on a substrate comprising sapphire is formed through the following procedure by utilizing a general reduced-pressure MOCVD technique. First, a substrate 1 comprising (0001)-sapphire was placed on a susceptor made of a high-purity graphite for a semiconductor, which is heated to a film-forming temperature by a high frequency (RF) induction heating-type heater. Thereafter, a nitrogen gas was flowed into the stainless steel-made vapor phase growth reaction furnace to purge the inside of the furnace.

After flowing a nitrogen gas into the vapor phase growth reaction furnace over 8 minutes, the induction heating-type heater was actuated and the temperature of the substrate 1 was elevated from room temperature to 600° C. in 10 minutes. While keeping the substrate 1 temperature at 600° C., a hydrogen gas and a nitrogen gas were flowed to set the pressure inside the vapor phase growth reaction furnace to $1.5\times10^4$ Pascal (Pa). The substrate 1 was left standing at these temperature and pressure for 2 minutes and subjected to thermal cleaning of the surface thereof. After the completion of thermal cleaning, the supply of a nitrogen gas into the vapor phase growth reaction furnace was stopped. The supply of a hydrogen gas was continued.

Thereafter, the substrate 1 temperature was elevated to 1,120° C. in a hydrogen atmosphere. After confirming that the temperature was stabilized at 1,120° C., a hydrogen gas accompanied with trimethylaluminum (TMA) vapor was supplied into the vapor phase growth reaction furnace for 8 minutes and 30 seconds, whereby the TMA was reacted with a nitrogen atom generated resulting from the decomposition of a nitrogen-containing precipitation deposit earlier attached to the inner wall of the vapor phase growth reaction furnace and a buffer layer 2 comprising an aluminum nitride (AlN) thin film having a thickness of several nm was attached on the sapphire substrate 1. The supply of a hydrogen gas, accompanied with TMA vapor into the vapor phase growth reaction furnace was stopped to terminate the growth of AlN and after waiting for 4 minutes, TMA remaining in the vapor phase growth furnace was completely discharged.

Subsequently, an ammonia ($NH_3$) gas was supplied into the vapor phase growth reaction furnace and after the passing of 4 minutes, the susceptor temperature was lowered to 1,040° C. while continuing to flow an ammonia gas. After confirming that the susceptor temperature became 1,040° C. and then waiting for a while until the temperature was stabilized, the supply of trimethylgallium (TMG) into the vapor phase growth reaction furnace was started and an underlying layer 3 comprising an undoped GaN was grown over 15 minutes. The thickness of the underlying layer 3 was 0.5 μm.

Next, the pressure inside a stainless steel vessel containing tetramethylgermanium ($(CH_3)_4Ge$) was kept at 200 kPa (2,000 mbar) and in this state, 40 sccm ($cm^3/min$ in terms of the standard state) of a hydrogen gas was flowed, thereby supplying tetramethylgermanium into the reaction furnace. By controlling the supply amount of Ge, the amount of Ge incorporated into a GaN crystal and in turn, the pit density can be controlled. Here, the gas was flowed for 60 minutes to grow a pit-forming layer comprising Ge-doped GaN, namely, a high-concentration impurity atom layer 4, in 2 μm. Thereafter, the flow of $(CH_3)_4Ge$ was stopped for 1 hour and an undoped GaN pit-filling layer, namely, a low-concentration impurity atom layer 5, was allowed to grow in 2 μm, thereby filling the pits. This cycle was repeated twice to form a high-concentration impurity atom layer and a low-concentration impurity atom layer in a total thickness of 8.0 μm, where the Ge concentration was periodically changed.

After the growth of a low-concentration impurity atom layer 5 was completed, the current flow to the induction heating-type heater was stopped and the substrate 1 temperature was lowered to room temperature in about 20 minutes. During the temperature drop, the atmosphere inside the vapor phase growth reaction furnace was constituted only of nitrogen. After confirming that the substrate 1 temperature was lowered to room temperature, the stacked structure was taken outside from the vapor phase growth reaction furnace.

The obtained stacked structure was dipped in a mixed solution of sulfuric acid and phosphoric acid at 250° C. for 30 minutes. The density of dislocations observed as an etch pit on the surface of this stacked structure was measured by AFM (atomic force microscope) and found to be $8\times10^6\ cm^{-2}$. Furthermore, the Ge atom concentration of the high-concentration impurity atom layer 4 was measured by a secondary ion mass spectrometry (SIMS) and found to be $1\times10^{19}\ cm^{-3}$.

Also, on a sample separately taken out from the vapor phase growth reaction furnace at the stage where the growth of a high-concentration impurity atom layer 4 in the second cycle was completed, the pit density was measured by a fluorescent microscope and found to be $1\times10^7$ cm$^{-2}$.

Examples 2 to 3 and Comparative Examples 1 to 4

A stacked structure was produced in the same manner as in Example 1 except for changing the flow rate of the hydrogen gas supplied to the stainless steel vessel containing tetramethylgermanium ((CH$_3$)$_4$Ge) at the time of growing a high-concentration impurity atom layer 4.

The obtained stacked structure was evaluated in the same manner as in Example 1. The results thereof are shown in Table 1 together with the results of Example 1.

TABLE 1

| | | Flow Rate of Hydrogen Gas (sccm) | High-Concentration Impurity Atom Layer in Second Cycle | | Dislocation Density of Low-Concentration Impurity Atom Layer in Second Cycle (dislocations/cm$^2$) |
|---|---|---|---|---|---|
| | | | Ge Atom Concentration | Pit Density (pits/cm$^2$) | |
| Example | 1 | 40 | $1\times10^{19}$ cm$^{-3}$ | $1\times10^7$ | $8\times10^6$ |
| | 2 | 20 | $5\times10^{18}$ cm$^{-3}$ | $3\times10^6$ | $1\times10^7$ |
| | 3 | 80 | $2\times10^{19}$ cm$^{-3}$ | $3\times10^7$ | $1\times10^7$ |
| Comparative Example | 1 | 1 | $3\times10^{17}$ cm$^{-3}$ | $1\times10^5$ | $8\times10^8$ |
| | 2 | 5 | $1\times10^{18}$ cm$^{-3}$ | $3\times10^5$ | $1\times10^8$ |
| | 3 | 10 | $3\times10^{18}$ cm$^{-3}$ | $1\times10^6$ | $2\times10^7$ |
| | 4 | 120 | $3\times10^{19}$ cm$^{-3}$ | $1\times10^8$ | $2\times10^7$ |

Figure 2:
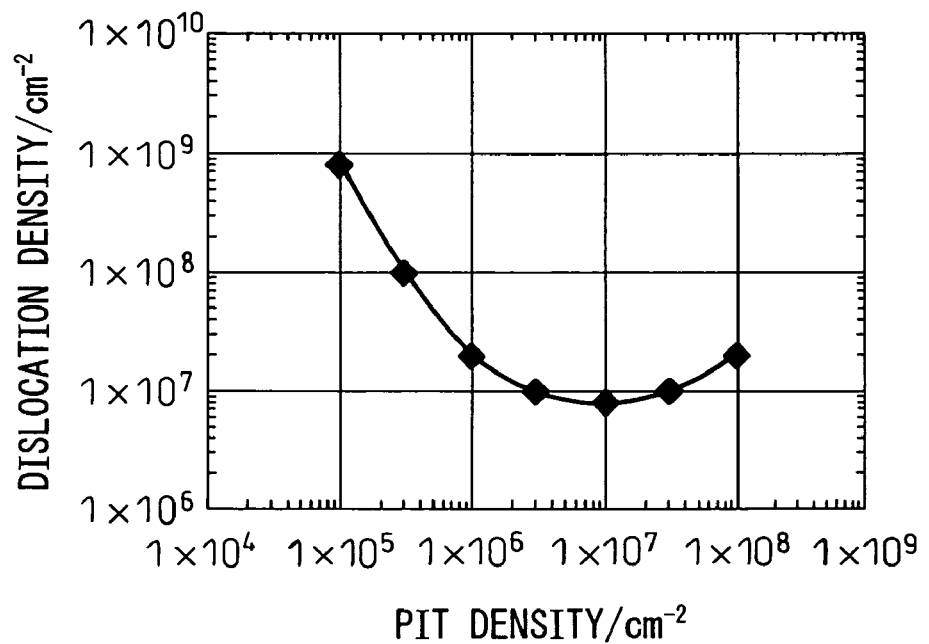
FIG. 2 is a view showing the relationship between the pit density of the high-concentration impurity atom layer and the dislocation density of the low-concentration impurity atom layer.

FIG. 2 shows the relationship between the dislocation density of the obtained stacked structure and the density of pits formed in the high-concentration impurity atom layer 4 in the second cycle. When the pit density in the high-concentration impurity atom layer 4 is small, the probability of a dislocation impinging on the pit plane and inflecting the direction is low and therefore, the effect of decreasing the dislocation density on the surface of the low-concentration impurity atom layer 5 is low. Also, when the pit density is excessively large, the pits are utterly coupled with each other and a flat part does not remain and, as a result, filling by the low-concentration impurity atom layer 5 is not successfully effected and not only the flatness but also the dislocation-reducing effect are worsened.

Example 4

Figure 3:
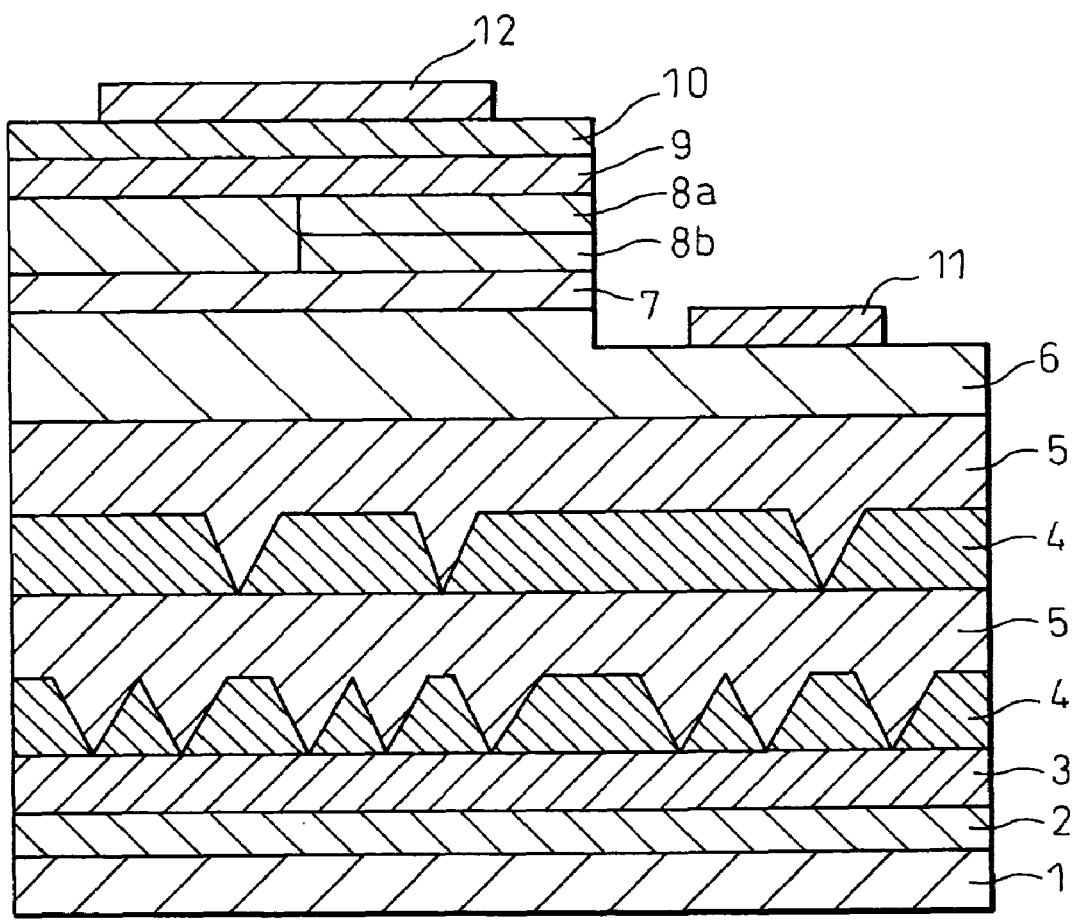
FIG. 3 is a view schematically showing the cross-sectional structure of the Group III nitride semiconductor light-emitting device produced in Example 4.

A Group III nitride semiconductor light-emitting device was produced by further stacking a Group III nitride semiconductor layer on the stacked structure produced in Example 1. FIG. 3 is a view schematically showing the cross-sectional structure of the Group III nitride semiconductor light-emitting device produced in this Example.

The procedure until the formation of the low-concentration impurity atom layer 5 was the same as that in Example 1. Thereafter, an n-contact layer 6 comprising Ge-doped GaN was stacked thereon at 1,120° C. and an n-clad layer 7 comprising undoped In$_{0.03}$Ga$_{0.97}$N was then stacked at 1,060° C. The thickness of the n-clad layer 7 was 12.5 nm. As for the n-contact layer 6 having a structure that a high-concentration Ge atom layer and a low-concentration Ge atom layer were alternately stacked in a repetition of 100 times, the total layer thickness was 2 μm.

Subsequently, the substrate 1 temperature was lowered to 730° C. and a multiple quantum well structure light-emitting layer 8 was provided on the n-clad layer 7. The multiple quantum well structure light-emitting layer 8 had a repeating structure of a barrier layer 8a comprising GaN and a well layer 8b comprising In$_{0.25}$Ga$_{0.75}$N, which started with a barrier layer 8a and ended similarly with a barrier layer 8a. The multiple quantum well structure here was consisting of 6 barrier layers 8a and 5 well layers 8b. That is, in the multiple quantum well structure light-emitting layer 8, a GaN barrier layer 8a was first provided by joining it to the n-clad layer 7, and the uppermost layer was also a GaN barrier layer 8a.

The GaN barrier layer 8a was grown by using triethylgallium (TEG) as the gallium source. The layer had a thickness of 8 nm and was undoped. The In$_{0.25}$Ga$_{0.75}$N well layer 8b was grown by using triethylgallium (TEG) as the gallium source and trimethylindium (TMI) as the indium source. The layer had a thickness of 2.5 nm and was undoped.

On the light-emitting layer 8 comprising a multiple quantum well structure, a p-clad layer 9 comprising magnesium (Mg)-doped p-type Al$_{0.07}$Ga$_{0.93}$N was formed. The layer thickness was 10 nm. On the p-clad layer 9, a p-contact layer 10 comprising Mg-doped p-type GaN was further formed. As the Mg doping source, bis-cyclopentadienyl Mg was used. Mg was added so that the p-contact layer 10 could have a hole concentration of $8\times10^{17}$ cm$^{-3}$. The layer thickness of the p-contact layer 10 was 100 nm.

After the growth of the p-type GaN contact layer 10 was completed, the current flow to the induction heating-type heater was stopped and the substrate 1 temperature was lowered to room temperature in about 20 minutes. During the temperature drop, the atmosphere inside the vapor phase growth reaction furnace was constituted only of nitrogen. After confirming that the substrate 1 temperature was lowered to room temperature, the stacked structure was taken outside from the vapor phase growth reaction furnace. At this point of time, the p-type GaN contact layer 10 already exhibited p-type conductivity even without performing an annealing treatment for electrically activating the p-type carrier (Mg).

Subsequently, the high-concentration Ge atom layer of the Ge-doped n-type GaN layer 6, only in the region where an n-type ohmic electrode 11 was to be formed, was exposed by using a known photolithography technique and a general dry etching technique. On the surface of the exposed high-concentration Ge atom layer, titanium and gold were stacked (on the semiconductor side, titanium) to form a negative electrode 11. In the entire region of the remaining surface of the p-type GaN contact layer 10 forming the surface of the stacked structure, nickel and gold were stacked in this order from the semiconductor side by utilizing general vacuum deposition means and known photolithography means to form a positive electrode 12.

Thereafter, the stacked structure was cut into a 350 μm-square LED chip and the chip was placed on a lead frame, and a gold lead wire was connected to the lead frame so that an operating current could flow from the lead frame to the LED chip.

An operating current was passed in the forward direction between the negative electrode 11 and the positive electrode 12 through the lead frame. When the forward current was 20 mA, the forward voltage was 3.5 V. Also, when a forward current of 20 mA was passed, the peak wavelength of the emitted blue light was 460 nm. Furthermore, the light emission intensity measured by using a general integrating sphere was as high as 6 mW, and a Group III nitride semiconductor light-emitting device giving high-intensity light emission was obtained. The voltage with a reverse current flow of 10 μA was good and 30 V or more, and the electrostatic breakdown voltage by the machine model was also good and 500 V or more.

Comparative Example 5

A Group III nitride semiconductor stacked structure was produced in the same manner as in Example 1 except that the thickness of the underlying layer was changed to 8.5 μm and the high-concentration impurity atom layer and the low-concentration impurity atom layer were not provided. The dislocation density on the surface of the obtained stacked structure was $2\times10^9$ cm$^{-2}$.

Using this stacked structure, a Group III nitride semiconductor light-emitting device was produced in the same manner as in Example 4. The voltage in the forward and reverse directions and the light emission intensity were measured in the same manner as in Example 4 and, as a result, the forward voltage was 3.5 V similarly to Example 4 but the light emission intensity was low, as compared with Example 4, and was 5 mW. Furthermore, the voltage with a reverse current flow of 10 μA was about 15 V and the electrostatic breakdown voltage property by the machine model was also inferior to Example 4 and was 200 V.

The stacked structure obtained in the present invention is very reduced in the dislocation density of the Group III nitride semiconductor layer and therefore, useful for a Group III nitride semiconductor device, for example, a Group III nitride semiconductor light-emitting device.

What is claimed is:

1. A stacked structure for a Group III nitride semiconductor device, comprising a flat substrate having a surface roughness (Ra) of 1 nm or less and a Group III nitride semiconductor layer directly stacked on the substrate, the Group III nitride semiconductor layer comprising a plurality of layers put into contact with each other, at least a pair of layers out of the plurality of layers put into contact with each other being a high-concentration impurity atom layer and a low-concentration impurity atom layer, the thickness of the high-concentration impurity atom layer being from 0.5 to 3 μm, the high-concentration impurity atom layer being present on the substrate side, wherein pits are present in the range from $1\times10^5$ cm$^{-2}$ to $5\times10^8$ cm$^{-2}$ on the surface of the high-concentration impurity atom layer opposite the substrate, and at least one of the plurality of layers being a layer having a dislocation density of $1\times10^7$ cm$^{-2}$ or less.

2. The stacked structure for a Group III nitride semiconductor device according to claim 1, wherein a high-concentration impurity atom layer and a low-concentration impurity atom layer are present alternately and periodically.

3. The stacked structure for a Group III nitride semiconductor device according to claim 2, wherein the periodic number is from 1 to 10.

4. The stacked structure for a Group III nitride semiconductor device according to claim 1, wherein the impurity is one member selected from the group consisting of Si, Ge, Sn, S, Se, Mg and Zn, or a combination of two or more members selected therefrom.

5. The stacked structure for a Group III nitride semiconductor device according to claim 4, wherein the impurity is Ge.

6. The stacked structure for a Group III nitride semiconductor device according to claim 1, wherein the impurity concentration of the high-concentration impurity atom layer is from $5\times10^{17}$ to $4\times10^{19}$ cm$^{31\ 3}$.

7. The stacked structure for a Group III nitride semiconductor device according to claim 1 wherein the impurity concentration of the low-concentration impurity atom layer is lower than the impurity concentration of the high-concentration impurity atom layer and is $2\times10^{19}$ cm$^{-3}$ or less.

8. The stacked structure for a Group III nitride semiconductor device according to claim 7, wherein the low-concentration impurity atom layer is not intentionally doped with an impurity.

9. The stacked structure for a Group III nitride semiconductor device according to claim 1 wherein the thickness of the low-concentration impurity atom layer is from 0.1 to 10 μm.

10. The stacked structure for a Group III nitride semiconductor device according to claim 1, wherein the entire thickness of the high-concentration impurity atom layer and the low-concentration impurity atom layer is from 1 to 1,000 μm.

11. A Group III nitride semiconductor light-emitting device having an n-type layer, a light-emitting layer and a p-type layer in this order, each comprising a Group III nitride semiconductor layer, on the stacked structure for a Group III nitride semiconductor device according to claim 1, in which a negative electrode and a positive electrode are provided on the n-type layer and the p-type layer, respectively.

12. A lamp comprising the light-emitting device according to claim 11.

* * * * *